United States Patent
Shirai (10) Patent No.: US 8,039,820 B2
(45) Date of Patent: Oct. 18, 2011

(54) CONNECTION DEVICE

(75) Inventor: Takahiro Shirai, Gotenba (JP)

(73) Assignee: Ushio Denki Kabushiki Kaisha, Tokyo-to (JP)

( * ) Notice: Subject to any disclaimer, the term of this patent is extended or adjusted under 35 U.S.C. 154(b) by 274 days.

(21) Appl. No.: 12/396,674

(22) Filed: Mar. 3, 2009

(65) Prior Publication Data

US 2009/0224179 A1    Sep. 10, 2009

(30) Foreign Application Priority Data

Mar. 4, 2008   (JP) ................................ P2008-053031

(51) Int. Cl.
G21K 5/00   (2006.01)
(52) U.S. Cl. .................... 250/492.1; 250/504 R; 355/30
(58) Field of Classification Search ................. 250/492.1
See application file for complete search history.

(56) References Cited

U.S. PATENT DOCUMENTS

| | | | |
|---|---|---|---|
| 7,002,168 B2 * | 2/2006 | Jacob et al. ................ | 250/504 R |
| 7,598,508 B2 * | 10/2009 | Sogard ...................... | 250/504 R |
| 2003/0142280 A1 | 7/2003 | Bakker et al. | |
| 2004/0075063 A1 | 4/2004 | Hasegawa et al. | |
| 2004/0099816 A1 | 5/2004 | Roux | |
| 2007/0080307 A1 | 4/2007 | Bruijn et al. | |

FOREIGN PATENT DOCUMENTS

| | | |
|---|---|---|
| EP | 1 422 568 | 5/2004 |
| EP | 1 708 032 | 10/2006 |
| JP | 2004-172626 | 6/2004 |
| JP | 2006-529057 | 12/2006 |
| WO | WO 00/28384 | 5/2000 |
| WO | 2004/104707 | 12/2004 |

* cited by examiner

*Primary Examiner* — Phillip A Johnston
(74) *Attorney, Agent, or Firm* — Drinker Biddle & Reath LLP (57) ABSTRACT

There is provided a connection device for connecting a first depressurization vessel to a second depressurization vessel. The connection device includes a communication hole comprising a first opening which is connected to the first depressurization vessel, and a second opening which is connected to the second depressurization vessel, the first opening and the second opening being, respectively, at opposite ends of the communication hole such that extreme ultraviolet radiation passes in a radiation direction from the first opening to the second opening; a gas inlet through which a gas flows into the communication hole in a direction perpendicular to the radiation direction of the extreme ultraviolet radiation; and a gas outlet which is opposed to the gas inlet such that the gas passes out the gas outlet.

6 Claims, 9 Drawing Sheets

CONNECTION DEVICE

This application claims priority from Japanese Patent Application No. 2008-053031, filed on Mar. 4, 2008, the entire contents of which are hereby incorporated by reference.

BACKGROUND OF THE INVENTION

1. Technical Field

Devices and apparatuses consistent with the present disclosure relate to extreme ultraviolet radiation and, more particularly, to a connection device provided between an extreme ultraviolet radiation source and an extreme ultraviolet radiation receiving device.

2. Related Art

Figure 7:
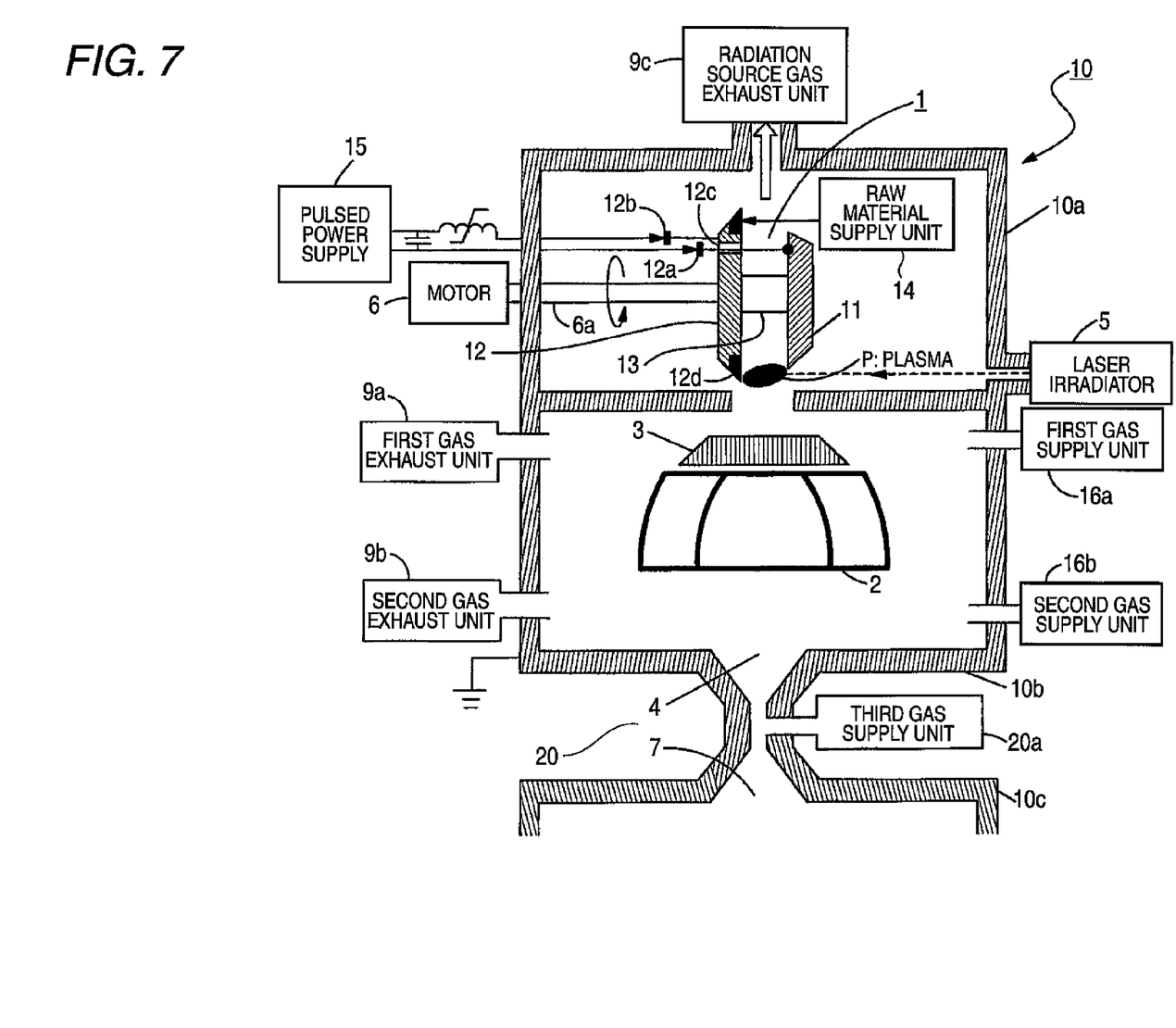
FIG. 7 is a diagram illustrating a configuration of a related-art connection device.

FIG. 7 shows an example of a configuration of a related-art connection device between an extreme ultraviolet radiation source (hereinafter, referred to as an "EUV radiation source") and a chamber containing an exposure tool. FIG. 7 is a cross-sectional view taken along an optical axis.

The EUV radiation source has a chamber 10 as a discharge vessel. The chamber 10 of the EUV radiation source includes a first chamber 10a and a second chamber 10b. The first chamber 10a is provided with a discharge portion 1 for heating and exciting an EUV radiating species. The second chamber 10b is provided with an EUV collector mirror 2 for collecting EUV radiation. The EUV radiation is emitted from high temperature plasma generated from the EUV radiating species heated and excited by the discharge portion 1.

The EUV collector mirror 2 collects the EUV radiation, and guides the EUV radiation from an EUV radiation output portion 4 of the second chamber 10b to an irradiation optical system including an exposure tool (not shown).

The first chamber 10a is connected to exhaust unit 9c. The second chamber 10b is connected to a first gas supply unit 16a and a second gas supply unit 16b for supplying cleaning gas or the like and also is connected to a first gas exhaust unit 9a and a second gas exhaust unit 9b. The insides of the chambers 10a and 10b are depressurized by the gas exhaust units 9a, 9b, and 9c.

In the discharge portion 1, a first discharge electrode 11 as a disk-shaped member made of metal and a second discharge electrode 12 as a disk-shaped member made of metal are disposed with an insulator 13 interposed therebetween.

The center of the first discharge electrode 11 and the center of the second discharge electrode 12 are substantially on the same axis, and the first discharge electrode 11 and the second discharge electrode 12 are fixed at positions away from each other by a thickness of the insulator 13. A diameter of the second discharge electrode 12 is larger than that of the first discharge electrode 11. The thickness of the insulator 13, that is, a distance between the first discharge electrode 11 and the second discharge electrode 12 is about 1 mm to about 10 mm.

A rotating shaft 6a of a motor 6 is attached to the second discharge electrode 12 such that the center of the first discharge electrode 11 and the center of the second discharge electrode 12 are substantially on the same rotating axis of the rotating shaft 6a. The rotating shaft 6a is introduced into the chamber 10 with, for example, a mechanical seal. The mechanical seal allows the rotating shaft 6a to rotate with the depressurized atmosphere kept in the chamber 10.

A first wiper 12a and a second wiper 12b formed of, for example, carbon brush or the like are provided below the second discharge electrode 12.

The second wiper 12b is electrically connected to the second discharge electrode 12. The first wiper 12a is electrically connected to the first discharge electrode 11 through a through hole 12c penetrating the second discharge electrode 12.

Insulation breakdown does not occur between the first wiper 12a and the second discharge electrode 12. The first wiper 12a and the second wiper 12b are configured as electrical contact points keeping electrical connection while the first wiper 12a and the second wiper 12b are wiped, and are connected to a pulsed power supply 15.

The pulsed power supply 15 supplies pulsed power between the rotating first discharge electrode 11 and second discharge electrode 12 through the first wiper 12a and the second wiper 12b.

Peripheral portions of the first discharge electrode 11 and the second discharge electrode 12, which are the disk-shaped members made of metal, are tapered to produce a pointed edge. In other words, a diameter of the first discharge electrode 11 on a side facing the second discharge electrode 12 is slightly larger than a diameter of the first discharge electrode 11 on the opposite side from the second discharge electrode 12. Similarly, a diameter of the second discharge electrode 12 on a side facing the first discharge electrode 11 is slightly larger than a diameter of the second discharge electrode 12 on the opposite side from the first discharge electrode 11. When power is applied from the pulsed power supply 15 to the first discharge electrode 11 and the second discharge electrode 12 as described later, electrical discharge occurs between the tapered edge portions of the electrodes.

When the electrical discharge occurs, temperature of the vicinity of the electrodes becomes high. Accordingly, the first discharge electrode 11 and the second discharge electrode 12 are made of high melting point metal such as tungsten, molybdenum, and tantalum. The insulator is made of, for example, silicon nitride, aluminum nitride, diamond, and the like.

Solid tin (Sn) or solid lithium (Li) as a raw material for producing high temperature plasma is supplied to the discharge portion 1. The raw material is supplied from a raw material supply unit 14 to a groove portion 12d formed around the peripheral portion of the second discharge electrode 12. That is, the raw material is supplied into the groove portion 12d of the disk-shaped member that forms the second discharge electrode 12. The motor 6 rotates in only one direction, the rotating shaft 6a is rotated by the operation of the motor 6, and the first discharge electrode 11 and the second discharge electrode 12 connected to the rotating shaft 6a are rotated in one direction. Sn or Li supplied to the groove portion 12d of the second discharge electrode 12 is moved toward the EUV radiation outgoing side in the discharge portion 1 by the rotation of the second discharge electrode 12.

The chamber 10 is provided with a laser irradiator 5 for irradiating laser onto the Sn or Li that is moved toward the EUV radiation outgoing side. The laser irradiator 5 may be formed of YAG laser, $CO_2$ laser, or the like.

The laser from the laser irradiator 5 is irradiated onto Sn or Li which is in the groove portion of the second discharge electrode 12 moved toward the EUV radiation outgoing side through a laser collecting means and a laser transmission window portion (not shown) in the chamber 10. As described above, the diameter of the second discharge electrode 12 is larger than that of the first discharge electrode 11. Accordingly, the laser passes by the side of the first discharge electrode 11 and is irradiated onto the groove portion 12d of the second discharge electrode 12.

The EUV radiation from the discharge portion 1 is radiated as follows.

The laser is irradiated from the laser irradiator 5 onto the Sn or Li in the groove portion 12d. The Sn or Li irradiated with the laser is evaporated between the first discharge electrode 11 and the second discharge electrode 12, and a part of the Sn or Li is ionized. Under such a condition, when the pulsed power supply 15 applies pulsed power, a voltage of which is about +20 kV to about −20 kV, between the first discharge electrode 11 and the second discharge electrode 12, an electrical discharge occurs between the tapered edge portions provided at the peripheral portions of the first discharge electrode 11 and the second discharge electrode 12.

At this time, pulse-shaped high current flows at the partially ionized portion of Sn or Li evaporated between the first discharge electrode 11 and the second discharge electrode 12. A high temperature plasma P is formed, at the peripheral portion of the both electrodes, from the evaporated Sn or Li by Joule heating of the pinch effect, and EUV radiation having a wavelength of 13.5 nm radiates from the high temperature plasma P. As described above, since the pulsed power is applied between the first discharge electrode 11 and the second discharge electrode 12, the electrical discharge is a pulse discharge and the radiating EUV radiation is a pulse radiation having a pulse shape.

The EUV radiation radiated from the discharge portion 1 is collected by an oblique-incidence type EUV collector mirror 2, and is guided, via the EUV radiation output portion 4 provided in the second chamber lob, to the irradiation optical system of the exposure tool (not shown) provided in a third chamber 10c.

The EUV collector mirror 2 includes a plurality of, for example, rotating oval bodies having different diameters or paraboloid mirrors. The rotating center axes of the mirrors are overlapped with one another so that focal positions thereof substantially coincide with one another. The mirrors are configured to satisfactorily reflect EUV radiation having an oblique incident angle of about 0 to about 25 degrees by minutely coating a reflection side of a base material having a smooth surface formed of, for example, nickel (Ni) or the like, with a metal film such as ruthenium (Ru), molybdenum (Mo), or rhodium (Rh).

A foil trap 3 is disposed between the discharge portion 1 and the EUV collector mirror 2 to prevent damage of the EUV collector mirror 2. The foil trap 3 catches debris such as metal powder generated by sputtering the first discharge electrode 11 and the second discharge electrode 12 which are in contact with the high temperature plasma, or debris caused by Sn or Li that is a radiating species, and thus allows only EUV radiation to pass. The foil trap 3 includes a plurality of plates (foil) and a ring-shaped supporter for supporting the plates. The plates are disposed in a diameter direction of a high temperature plasma generating area so as not to block the EUV radiation from the high temperature plasma.

When the foil trap 3 is provided between the discharge portion 1 and the EUV collector mirror 2, pressure between the high temperature plasma P and the foil trap 3 increases and thus collision of debris increases. The debris reduces the kinetic energy by repeated collision. Accordingly, energy of the debris is reduced when the debris collides with the EUV collector mirror 2, and thus it is possible to reduce damage to the EUV collector mirror 2.

As described above, the EUV radiation radiated from the high temperature plasma P generated in the EUV radiation source is collected by the EUV collector mirror 2, and is sent out via the EUV radiation output portion 4 of the second chamber 10b.

The EUV radiation output portion 4 is connected to an EUV radiation output portion 7 provided in a housing of the exposure tool. That is, the EUV radiation collected from the EUV collector mirror 2 enters the exposure tool through the EUV radiation output portion 4 and the EUV radiation output portion 7.

The exposure tool has an illumination optical system for application of the incident EUV radiation. The illumination optical system forms a shape of the EUV radiation incident from the EUV radiation output portion 7, and then irradiates a mask formed with a circuit pattern.

The optical system in the exposure tool has no glass material allowing the EUV radiation to pass therethrough. Accordingly, a reflection optical system is employed instead of a transmission optical system such as a lens system, and the illumination optical system includes reflection type optical elements such as one or more reflection mirrors. The light reflected by the reflection type mask is reduced and projected onto a work (for example, a wafer coated with resist) by a projection optical system, and a reduced circuit pattern of the mask is formed on the work. Similarly to the illumination optical system, the projection optical system also employs a reflection optical system, and includes reflection type optical elements such as one or more reflection mirrors.

The EUV radiation is absorbed by air, and thus components such as an illumination optical system of an exposure tool, a mask, a projection optical system, a work, and a work stage are installed in a vacuum. These components are installed in a housing of the exposure tool. Gas existing in the housing is exhausted by a gas exhaust unit, and an inside of the housing is kept at a low pressure.

The EUV radiation receiving unit 7 provided in the housing of the exposure tool and the EUV radiation output portion 4 provided in the EUV radiation source are connected to each other through a connection device 20. The inside of the chamber (second chamber 10b) of the EUV radiation source and the inside of the housing (third chamber 10c) of the exposure tool have a structure capable of differential pumping by the gas exhaust units, respectively.

In the EUV radiation source, various kinds of gas are used such as a gas for generating a high temperature plasma for radiating the EUV radiation, a gas for reducing the debris caused by the high temperature plasma or electrode materials, and a gas for cleaning an inner wall of the chamber or the collector mirror. For example, JP-T-2006-529057 describes that cleaning of debris may be performed with halogen gas.

Meanwhile, the inside of the exposure tool connected to the EUV radiation source is kept in a high vacuum state to prevent attenuation of the EUV radiation. For this reason, it is advantageous to prevent movement of gas from the EUV radiation source to the exposure tool. For example, JP-A-2004-172626 describes a related art technique for forming a barrier using a gas lock in a lithography device in which an EUV radiation source and an exposure tool are connected each other.

As described above, in the EUV radiation source for radiating the extreme ultraviolet radiation, the various kinds of gas are used. As such, the pressure of the EUV radiation source is set to about 1 Pa.

Meanwhile, the inside of the exposure tool, which is connected to the EUV radiation source and to which the extreme ultraviolet radiation is introduced, is also kept in a high vacuum state (for example, about $10^{-5}$ Pa) to prevent attenuation of the EUV radiation. Accordingly, unnecessary gas is removed from the inside of the exposure tool by performing a degassing process.

Thus, since the inner environments in the EUV radiation source and the exposure tool are different from each other, it is advantageous to prevent movement of gas from the EUV radiation source to the exposure tool on an interface between them. For example, a halogen gas used for cleaning is likely to decrease the characteristics of the optical components or to have an influence on a movement mechanism of the optical components. Accordingly, it is advantageous to prevent halogen gas from flowing into the exposure tool.

As a general blocking method for preventing the movement of gas, a physical blocking means (e.g., a gate valve, a thin film filter) has been proposed in the related art. However, in the related art gate valve, there is a disadvantage in that a connection portion is covered with a lid. Accordingly, the related art gate valve cannot be used during an exposure operation, i.e., during the generation of EUV radiation.

On the other hand, the related art thin film filter can be used during the exposure operation by selecting a material allowing the EUV radiation to pass therethrough. However, a pressure difference between the EUV radiation source and the exposure tool may be on the order of about $10^5$ Pa. Accordingly, there is a disadvantage in that in a case where the thin film filter has a thickness capable of withstanding the pressure difference, permeability of the EUV radiation decreases.

Accordingly, for example, as described in FIG. 7, the connection device 20 is provided in a differential pumping portion between the EUV radiation receiving portion 7 of the exposure tool and the EUV radiation output portion 4 of the second chamber 10b. In other words, the connection device 20 forms an interface between the EUV radiation source and the exposure tool. Gas is supplied from a third gas supply unit 20a to the connection device 20, and thus the movement of the gas on the interface between the EUV radiation source and the exposure tool is controlled.

Figure 8:
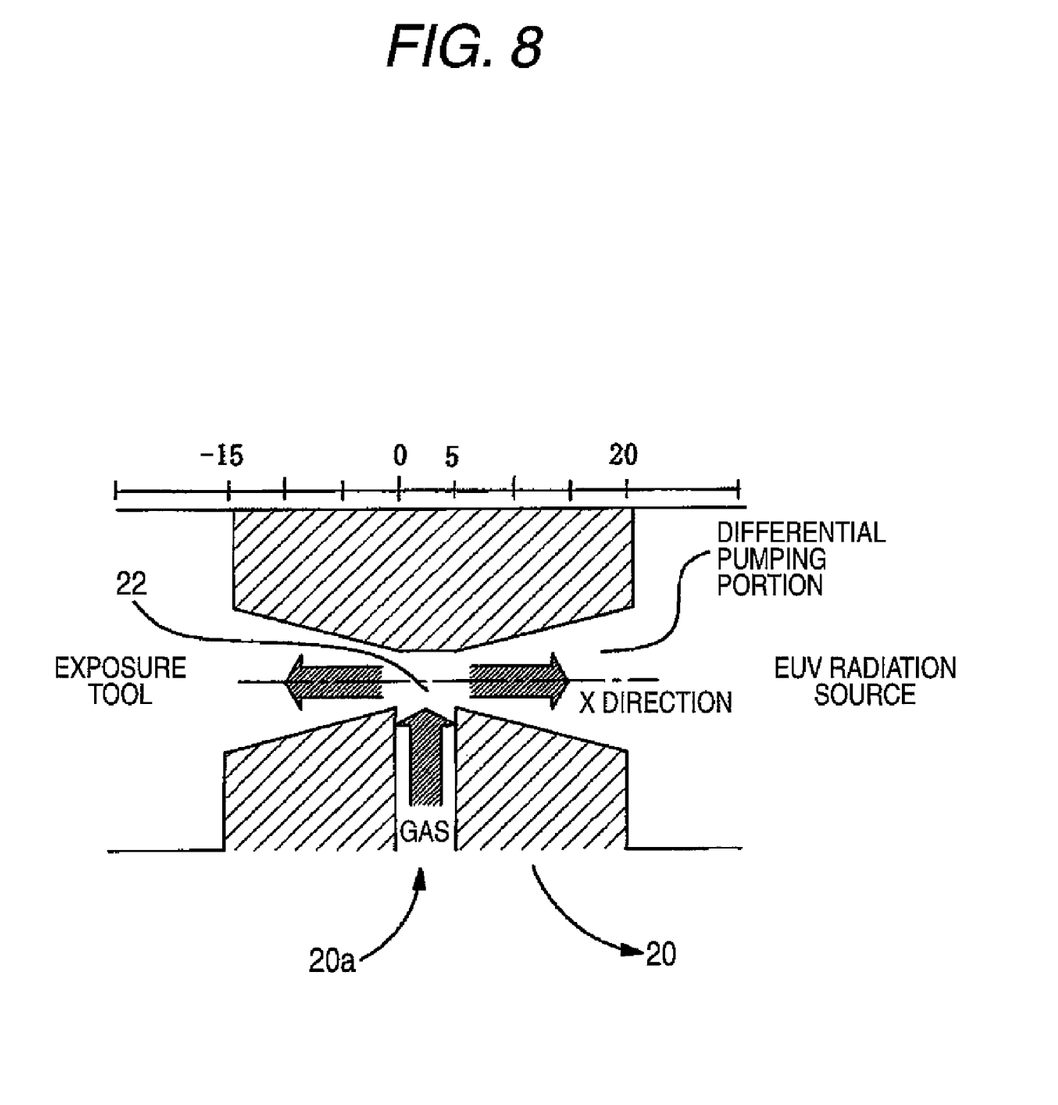
FIG. 8 is an enlarged schematic diagram showing an operation of the related-art connection device shown in FIG. 7.

That is, as shown in FIG. 8, a gas for preventing the movement of gas between the EUV radiation source and the exposure tool (hereinafter "stop gas") is supplied from the gas supply unit 20a to the connection device 20. The stop gas is allowed to flow in both directions toward the EUV radiation source and the exposure tool, and inflow of gas such as a cleaning gas from the EUV radiation source to the exposure tool is prevented.

JP-A-2004-172626 describes a related art lithography device for coupling a first chamber and a second chamber using a gas lock. In this case, the gas of the gas lock forms a barrier separating the first chamber and the second chamber.

Figure 9:
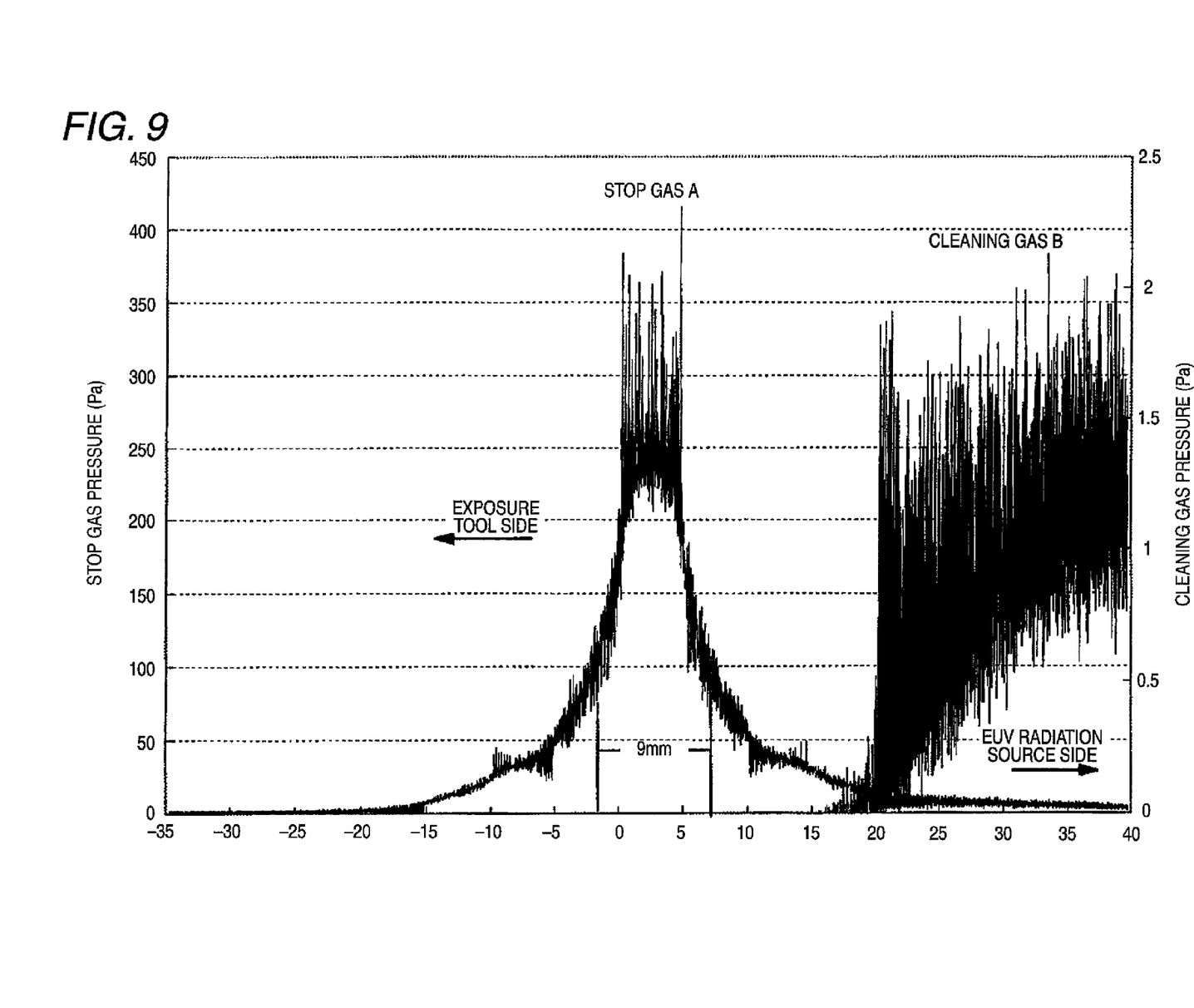
FIG. 9 is a diagram illustrating a gas pressure distribution of the related-art connection device of FIG. 7.

FIG. 9 shows an example of the gas pressure of the related art connection device 20 in case of using differential pumping and a stop gas. In FIG. 9, a horizontal axis represents a distance from a stop gas inlet in a center-axis direction (i.e., an X-axis direction in FIG. 8), and the right side in the same figure represents the EUV radiation source side. A position of 0 in the horizontal axis is a center position of the stop gas inlet (in FIG. 9, the position of 0 is shown in the scale of the horizontal axis). A vertical axis represents a pressure (Pa).

A graph A represents a pressure distribution of the stop gas supplied to a differential pumping portion, and a graph B represents a pressure distribution of a gas (e.g., cleaning gas) supplied to the EUV radiation source.

As can be seen from FIG. 9, the gas on the EUV radiation source side does not flow into the exposure tool side by the operations of the differential pumping and the stop gas.

However, while the related art connection device acts to prevent gas from flowing between the first chamber and the second chamber, the related art connection device has a few disadvantages. For example, when the stop gas is supplied to the differential pumping portion as described above, a high pressure layer is formed by the stop gas with respect to a passing direction of the EUV radiation. Accordingly, there is a disadvantage in that the EUV radiation does not easily pass through the high pressure layer (i.e., a permeability decreases). For example, as shown in FIG. 9, a thickness of a part where the pressure of the stop gas is 100 Pa with respect to the passing direction of the EUV radiation is about 9 mm. To reduce the thickness of the layer, it is conceivable to reduce a supply rate of the stop gas. However, if the supply rate of the stop gas is reduced to reduce the thickness, there is a disadvantage in that gas easily flows from the EUV radiation source into the exposure tool.

As described above, in order to prevent the movement of gas, it is conceivable to use the related art gate valve or the related art thin film filter. However, the related art gate valve has a disadvantage in that the gate valve cannot be used during the EUV radiation generation. The related art film filter has a disadvantage in that the permeability of the EUV radiation decreases.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any of the disadvantages described above.

Illustrative aspects of the present invention provide a connection device for connecting an extreme ultraviolet radiation outgoing device and an extreme ultraviolet radiation receiving device, in which gas in the extreme ultraviolet radiation outgoing device can be prevented from flowing into the extreme ultraviolet radiation receiving device without using a gate valve or a thin film filter; a thickness of a high pressure part, which is formed by a stop gas, in a differential pumping portion with respect to a passing direction of EUV radiation can be reduced as small as possible; and a decrease in permeability of the EUV radiation caused by the stop gas can be prevented.

According to one or more illustrative aspects of the present invention, there is provided a connection device for connecting a first depressurization vessel to a second depressurization vessel. The connection device comprises a communication hole comprising a first opening which is connected to the first depressurization vessel, and a second opening which is connected to the second depressurization vessel, the first opening and the second opening being, respectively, at opposite ends of the communication hole such that extreme ultraviolet radiation passes in a radiation direction from the first opening to the second opening; a gas inlet through which a gas flows into the communication hole in a direction perpendicular to the radiation direction of the extreme ultraviolet radiation; and a gas outlet which is opposed to the gas inlet such that the gas passes out the gas outlet.

According to one or more illustrative aspects of the present invention, there is provided an exposure equipment comprising a first depressurization vessel that comprises a component for radiating extreme ultraviolet radiation and a first opening through which the extreme ultraviolet radiation passes; a second depressurization vessel that comprises a second opening for receiving the extreme ultraviolet radiation passed from the first depressurization vessel; and a connection device which connects the first depressurization vessel to the second depressurization vessel; a gas supply unit; and a gas exhaust unit. The connection device comprises a communication hole comprising two opening ends disposed on opposite sides, respectively, of the communication hole, wherein the first opening and the second opening are opposed to each other and are connected to respective ones of the two opening ends; a gas inlet through which a gas, which does not absorb the extreme ultraviolet radiation, flows in a direction perpendicular to a passing direction of the extreme ultraviolet radiation; and a first gas outlet which is provided at a position opposed to the gas inlet so as to remove the gas from the communication hole; at least one second gas outlet which is provided between the second depressurization vessel and the first gas outlet so as to remove the gas from the communication hole; and at least one third gas outlet which is provided between the first depressurization vessel and the first gas outlet so as to remove the gas from the communication hole. The gas supply unit is connected to the gas inlet so as to supply the gas to the connection device. The gas exhaust unit comprises a first gas exhaust unit connected to the first gas outlet so as to remove the gas; a second gas exhaust unit connected to one of the at least one second gas outlet so as to remove the gas; and a third gas exhaust unit connected to one of the at least one third gas outlet so as to remove the gas.

Other aspects of the invention will be apparent from the following description, the drawings and the claims.

DETAILED DESCRIPTION OF EXEMPLARY EMBODIMENTS OF THE INVENTION

Exemplary embodiments of the present invention will be now described with reference to the drawings.

Figure 1:
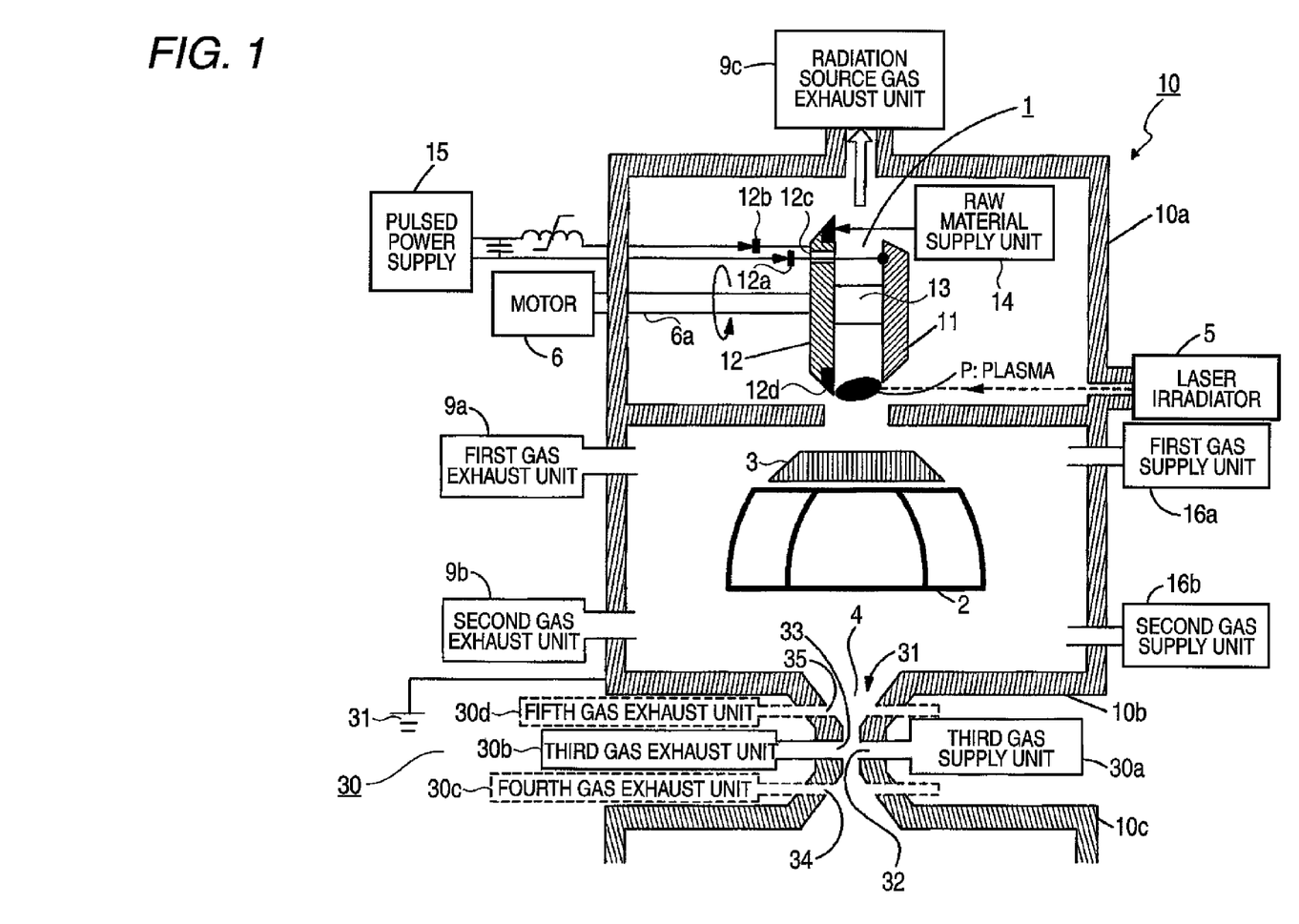
FIG. 1 is a diagram illustrating a configuration of a connection device according to an exemplary embodiment of the present invention.

FIG. 1 is a diagram illustrating a configuration of an EUV radiation source that is an extreme ultraviolet radiation outgoing device, and an exposure tool (not shown) that is an extreme ultraviolet radiation receiving device, which are connected to each other through a connection device 30 according to an exemplary embodiment of the present invention. First and second chambers 10a and 10b constituting the EUV radiation source correspond to the first depressurization vessel, and a third chamber 10c containing the exposure tool corresponds to the second depressurization vessel. FIG. 1 shows a cross-sectional view taken along a plane through which an optical axis of the EUV radiation passes.

The configuration of the EUV radiation source is the same as described in FIG. 7, and is briefly described hereinafter.

A chamber 10 of the EUV radiation source includes a first chamber 10a and a second chamber 10b. The first chamber 10a is provided therein with a discharge portion 1 as a heating and exciting means for heating and exciting an EUV radiating species. The second chamber 10b is provided therein with an EUV collector mirror 2 for collecting EUV radiation emitted from high temperature plasma generated from the EUV radiating species heated and excited by the discharge portion 1.

The first chamber 10a is connected to a exhaust unit 9c. The second chamber 10a is connected to a first gas supply unit 16a and a second gas supply unit 16b for supplying cleaning gas or the like and to a first gas exhaust unit 9a and a second gas exhaust unit 9b. The insides of the chambers 10a and 10b are depressurized by the gas exhaust units 9a, 9b, and 9c.

As described above, the discharge portion 1 has a structure in which a first discharge electrode 11 is a disk-shaped member made of metal, and a second discharge electrode 12 is a disk-shaped member made of metal. The first discharge electrode 11 and the second discharge electrode 12 are disposed with an insulator 13 interposed therebetween. A rotating shaft 6a of a motor 6 is mounted on the second discharge electrode 12.

A first wiper 12a and a second wiper 12b formed of, for example, carbon brush or the like are provided below the second discharge electrode 12. The second wiper 12b is electrically connected to the second discharge electrode 12. The first wiper 12a is electrically connected to the first discharge electrode 11 via a through hole 12c penetrating the second discharge electrode 12.

The first wiper 12a and the second wiper 12b are connected to a pulsed power supply 15. When power is applied from the pulsed power supply 15 to the first discharge electrode 11 and the second discharge electrode 12, electrical discharge occurs between the edge-shaped portions of the both electrodes.

Solid tin (Sn) or solid lithium (Li) as a raw material for high temperature plasma is supplied to the discharge portion 1, and the laser is irradiated from the laser irradiator 5 to Sn or Li.

The Sn or Li irradiated with the laser is evaporated between the first discharge electrode 11 and the second discharge electrode 12, and a part of the Sn or Li is ionized. Under such a condition, when pulsed power is applied from the pulsed power supply 15 between the first discharge electrode 11 and the second discharge electrode 12, electrical discharge occurs between the tapered portions provided at the peripheral portions of the first discharge electrode 11 and the second discharge electrodes 12.

At this time, a pulse-shaped high current flows at the partially ionized portion of Sn or Li evaporated between the first discharge electrode 11 and the second discharge electrode 12. Then, a high temperature plasma P is formed at the peripheral portion of the electrodes. The high temperature plasma P is formed from the evaporated Sn or Li by Joule heating of the pinch effect, and EUV radiation having a wavelength of 13.5 nm radiates from the high temperature plasma P.

The EUV radiation radiated by the discharge portion 1 is incident to an oblique incidence type EUV collector mirror 2 through a foil trap 3, and is collected by the EUV collector mirror 2. The EUV radiation is guided from the EUV radiation output portion 4 provided in the second chamber 10b through the connection device 30 into the third chamber 10c.

An EUV radiation receiving portion 7 provided in the housing (chamber 10c) of the exposure tool and the EUV radiation output portion 4 provided in the EUV radiation source are connected to each other through a connection device 30. The inside of the second chamber 10b of the EUV radiation source and the inside of the housing (third chamber 10c) of the exposure tool are capable of differential pumping by the respective gas exhaust units thereof.

The connection device 30 is provided at a differential pumping portion between the EUV radiation output portion 4 and the EUV radiation receiving portion 7. The connection device 30 includes a communication hole 31, and the EUV radiation output portion 4 and the EUV radiation receiving portion 7 are opposed to each other and are connected to opening ends on both sides of the communication hole 31 of the connection device 30.

The communication hole 31 is provided with a gas inlet 32 and a gas outlet 33 for exhausting the gas, which are opposed to each other. Stop gas which does not absorb extreme ultraviolet radiation is supplied from the third gas supply unit 30a to the gas inlet 32. The stop gas flows so as to intersect with the passing direction of the EUV radiation, and is forcedly exhausted from the gas outlet 33 by the gas exhaust unit 30b.

That is, a gas curtain is formed by the gas inlet 32 and the gas outlet 33, and gas such as a cleaning gas is prevented from flowing from the EUV radiation source into the exposure tool.

Figure 2A:
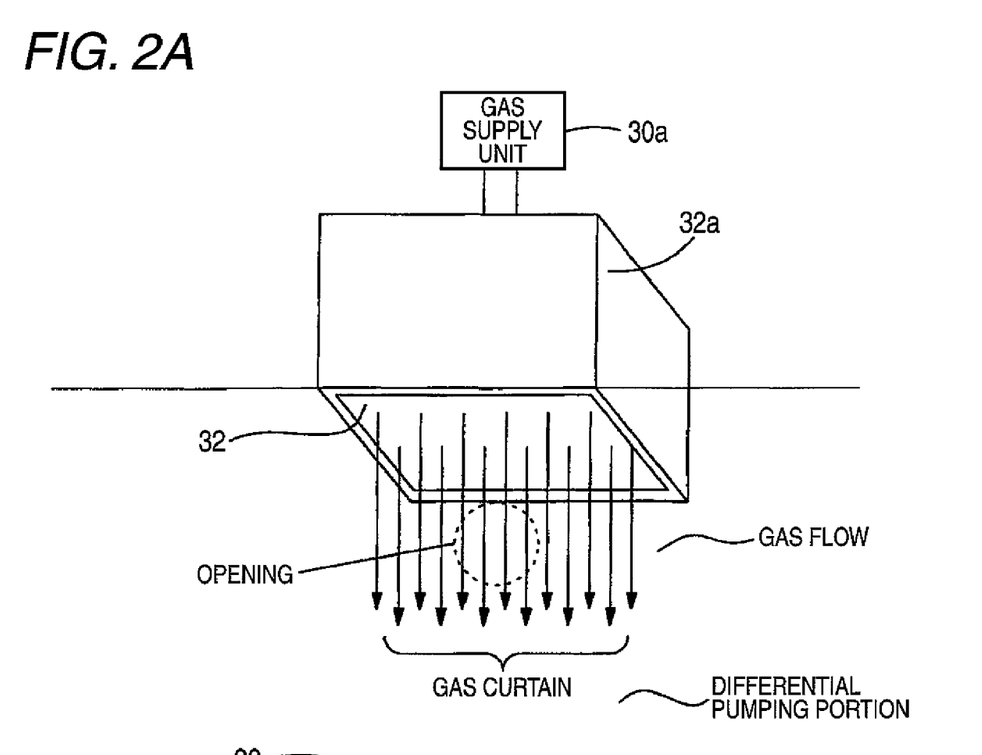
FIGS. 2A and 2B are diagrams illustrating respective configurations of a gas supply unit and a gas exhaust unit of the connection device of FIG. 1.
Figure 2B:
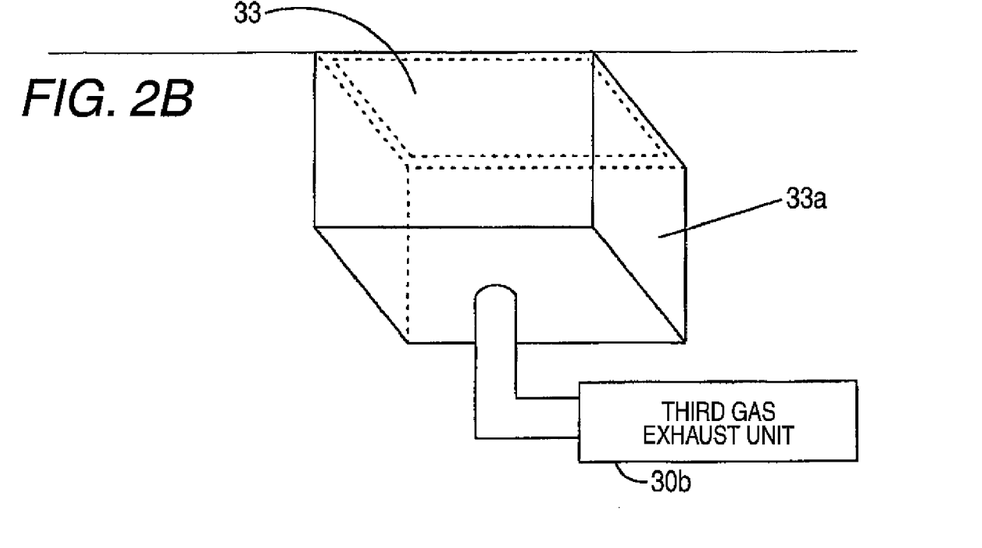

FIGS. 2A and 2B show an example of a configuration of the gas supply unit 30a and the gas exhaust unit 30b of the connection device 30, respectively.

The gas inlet 32 is provided with a nozzle 32a, and the stop gas is ejected from the nozzle 32a. Hydrogen absorbing a little EUV radiation or a rare gas (e.g., He, Ne, Ar, Kr, etc.) having no reactivity may be used as the stop gas.

The gas outlet 33 is provided with a diffuser 33a, and the diffuser 33a is opposed to the nozzle 32a on the gas supply unit 30a side. The stop gas ejected from the nozzle 32a is sucked into the diffuser 33a of the gas exhaust unit 30b and is exhausted.

In the above description, the connection device 30 is provided with the third gas supply unit 30a and the third gas exhaust unit 30b. However, as shown with dotted lines in FIG. 1, a fourth gas exhaust unit 30c is provided on the exposure tool side. With such a configuration, the gas, which is not exhausted from the third gas exhaust unit 30b and goes toward the exposure tool, may be exhausted. In addition, a fifth gas exhaust unit 30d may be provided on the EUV radiation source side. With such a configuration, the gas, which is not exhausted from the third gas exhaust unit 30b and goes toward the EUV radiation source, may be exhausted.

The gas outlets of the fourth gas exhaust unit 30c and the fifth gas exhaust unit 30d are provided, for example, in a ring shape along an inner periphery of the communication hole 31 of the connection device 30, and the gas is exhausted in a direction substantially perpendicular to the passing direction of the EUV radiation.

Figure 3A:
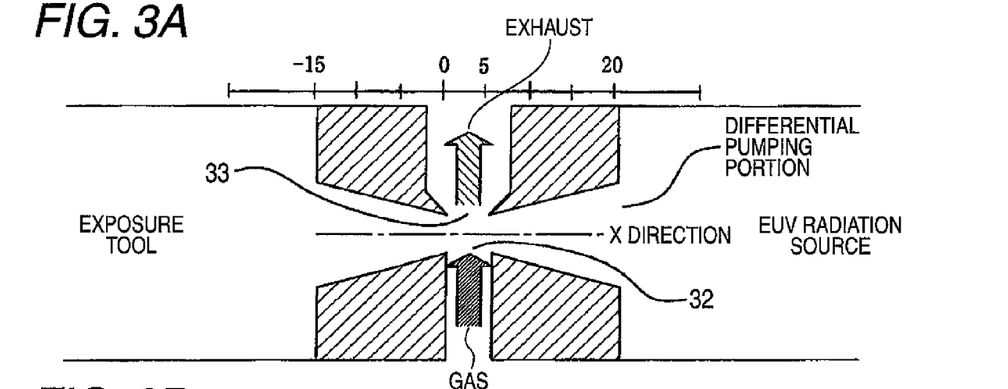
FIGS. 3A to 3C are enlarged schematic diagrams showing an operation of respective connection devices according to first to third exemplary embodiments of the present invention.
Figure 3B:
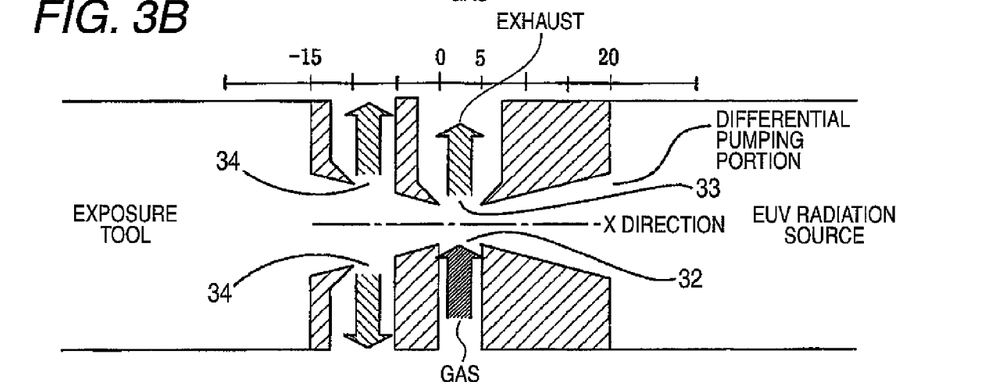
Figure 3C:
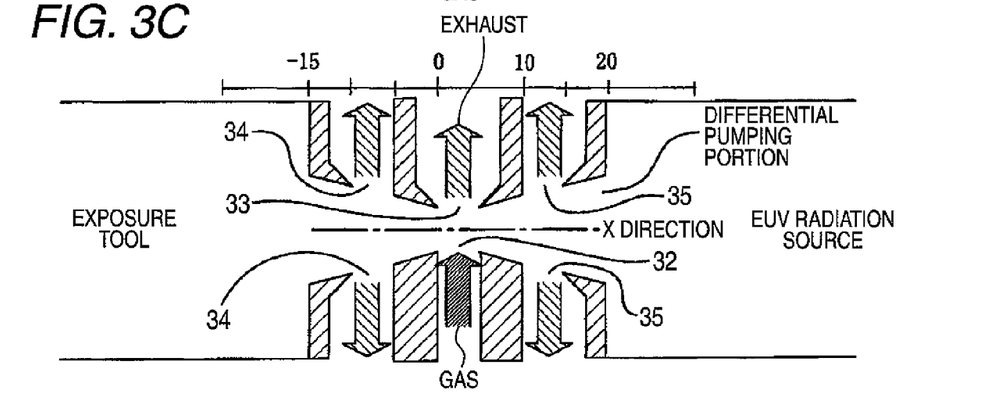

FIGS. 3A to 3C are enlarged diagrams of the connection device 30 at the interface between the EUV radiation source and the exposure tool, and are diagrams illustrating gas flow when the connection device 30 constituting the differential pumping portion is provided with the third gas supply unit 30a and the third gas exhaust unit 30b and is additionally provided with the fourth gas exhaust unit 30c and the fifth gas exhaust unit 30d.

As a first exemplary embodiment, FIG. 3A shows a state that the gas inlet 32 and the gas outlet 33 (third gas supply unit 30a and third gas exhaust unit 30b) are provided. As a second exemplary embodiment, FIG. 3B shows a state that the gas inlet 32 and the gas outlets 33 and 34 (third gas supply unit 30a, the third gas exhaust unit 30b and the fourth gas exhaust unit 30c) are provided. As a third exemplary embodiment, FIG. 3C shows a state that the gas inlet 32 and the gas outlets 33, 34, and 35 (the third gas supply unit 30a, the third gas exhaust unit 30b, the fourth gas exhaust unit 30c, and the fifth gas exhaust unit 30d) are provided.

First Exemplary Embodiment

Figure 4:
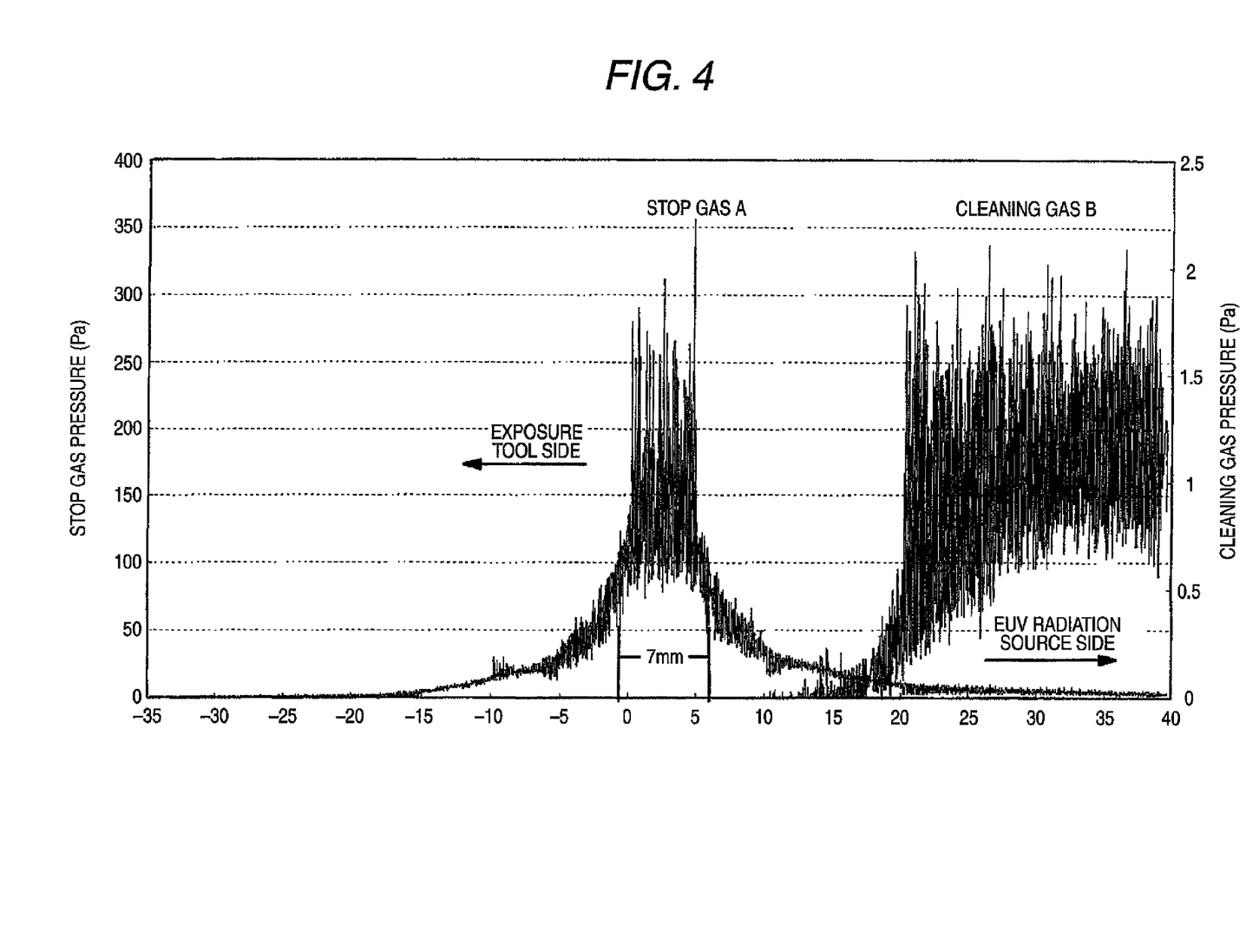
FIG. 4 is a diagram illustrating a gas pressure distribution of a connection device according to the first exemplary embodiment of the present invention.

FIG. 3A shows the first exemplary embodiment. As shown in FIG. 3A, the gas outlet 33 for the stop gas is provided to be opposed to the gas inlet 32 for the stop gas. The stop gas introduced from the gas inlet 32 forms a gas curtain forcedly exhausted from the gas outlet 33. FIG. 4 shows a gas pressure distribution of the connection device of the first exemplary embodiment. FIG. 4 shows a pressure distribution on the center axis (X-axis direction in FIG. 2) of the communication hole 31 of the connection device in the gas supply unit 30a and the gas exhaust unit 30b shown in FIG. 2. The openings of the gas inlet 32 and the gas outlet 33 have a rectangular shape of about 5 mm by 5 mm.

In FIG. 4, a horizontal axis represents a distance in the X-axis direction shown in FIG. 2 from the center of the stop gas inlet 32, and the right side in the same figure is the EUV radiation source side. A position of 0 in the horizontal axis is a center position of the stop gas inlet 32 (in FIG. 4, the position of 0 is shown in the scale of the horizontal axis). A vertical axis represents a pressure (Pa).

A graph A represents a pressure distribution of the stop gas, and a graph B represents a pressure distribution of the gas (e.g., cleaning gas) supplied to the EUV radiation source.

A thickness of a part where the pressure of the stop gas is 100 Pa with respect to the passing direction of the EUV radiation is about 7 mm. This thickness is smaller than the related-art thickness by about 2 mm. Absorption of radiation is determined by an absorption cross section area caused by gas concentration and a light path length, and is increased with an exponential function about the light path length. Accordingly, even when the thickness of the high pressure layer becomes slightly smaller, it is possible to improve permeability of the EUV radiation.

The increase of pressure caused by the introduction of the stop gas in the connection device 30 is also reduced as compared with the increase of pressure in the related art. Accordingly, it is possible to reduce the increase of pressure of the exposure tool caused by the stop gas, which leads to a reduced burden of the gas exhaust unit of the EUV radiation source or the exposure tool. Thus, it is possible to prevent the size of the gas exhaust unit from increasing.

Second Exemplary Embodiment

FIG. 3B shows the second exemplary embodiment. In the second exemplary embodiment, a gas outlet 34 is added on the exposure tool side of the gas inlet 32 and the gas outlet 33 of the first exemplary embodiment, respectively, and the gas is exhausted by the fourth gas exhaust unit 30c.

The stop gas is further prevented from flowing into the exposure tool by the gas outlet 34, thereby preventing the pressure of the exposure tool from increasing. In addition, the thickness of the high pressure part by the stop gas becomes smaller.

Figure 5:
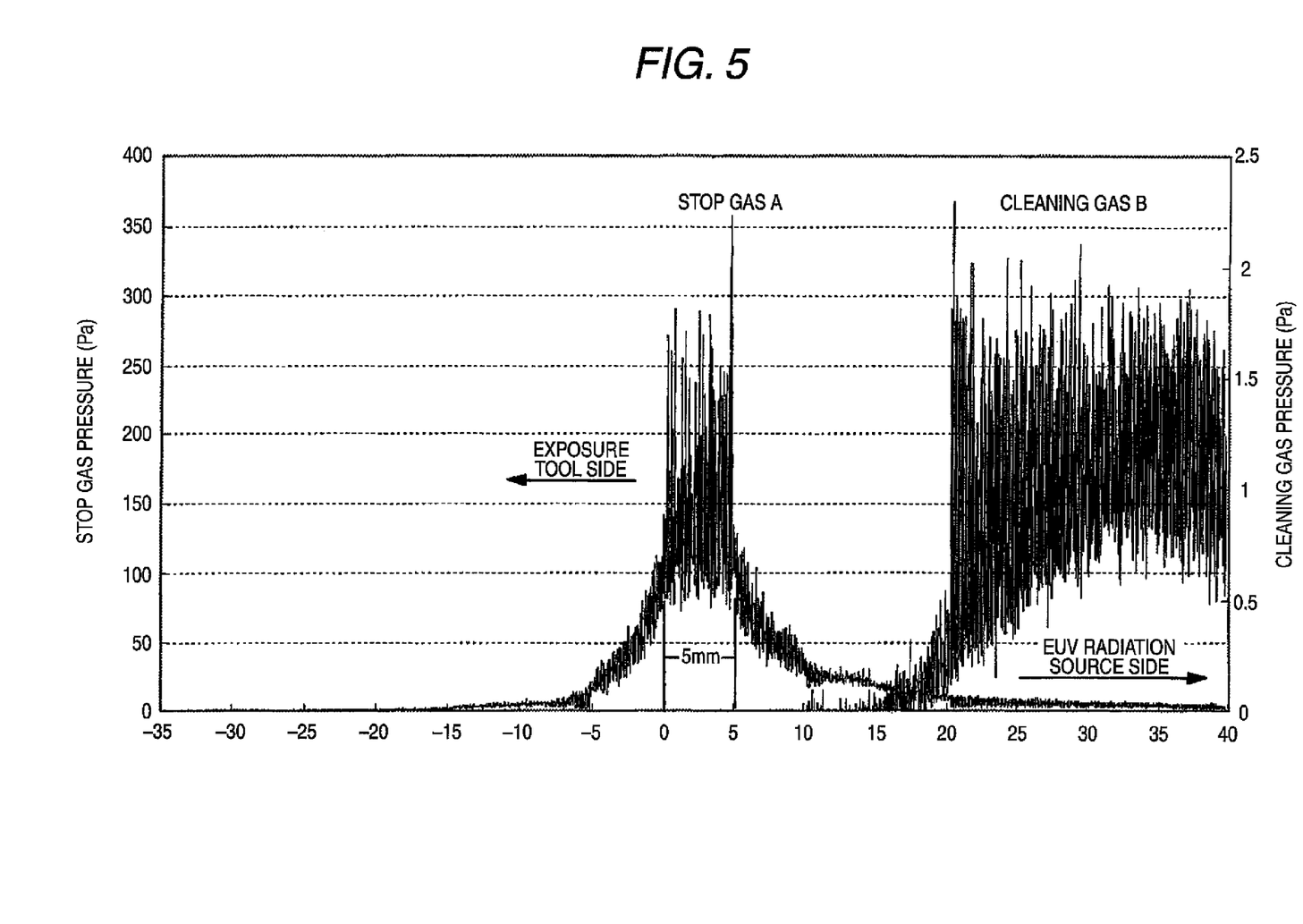
FIG. 5 is a diagram illustrating a gas pressure distribution of a connection device according to the second exemplary embodiment of the present invention.

FIG. 5 shows gas pressure distribution of the connection device of the second exemplary embodiment. Similarly to FIG. 4, FIG. 5 shows a pressure distribution on the X-axis in FIG. 2. A horizontal axis represents a distance in the X-axis direction shown in FIG. 2 from the center of the stop gas inlet 32, and a vertical axis represents a pressure (Pa). A graph A represents a pressure distribution of the stop gas, and a graph B represents a pressure distribution of the gas (e.g., cleaning gas) supplied to the EUV radiation source.

As shown in FIG. 5, the pressure of the stop gas on the exposure tool side decreases as compared with the pressure on the EUV radiation source side, and a thickness of a part where the pressure of the stop gas is 100 Pa with respect to the passing direction of the EUV radiation is about 5 mm. The permeability of the EUV radiation is further improved.

As described above, a hydrogen or rare gas is used as the stop gas. Such a gas includes a very small amount of water or carbon. When water or carbon is attached to the mirror of the exposure tool, reflectivity decreases. Accordingly, it is advantageous that stop gas does not flow into the exposure tool.

In the second exemplary embodiment, the added gas exhaust unit 30c only exhausts gas in a small space of the differential pumping portion, and thus may have a small size, which does not cause a great increase of cost.

Third Exemplary Embodiment

FIG. 3C shows the third exemplary embodiment. In the third exemplary embodiment, a gas outlet 35 is added on the EUV radiation source side of the gas inlet 32 and the gas outlet 33 of the second exemplary embodiment, respectively, and the gas is exhausted by the fifth gas exhaust unit 30d. The stop gas is further prevented from flowing into the EUV radiation source by the gas outlet 35, thereby preventing the pressure of the EUV radiation source from increasing.

Figure 6:
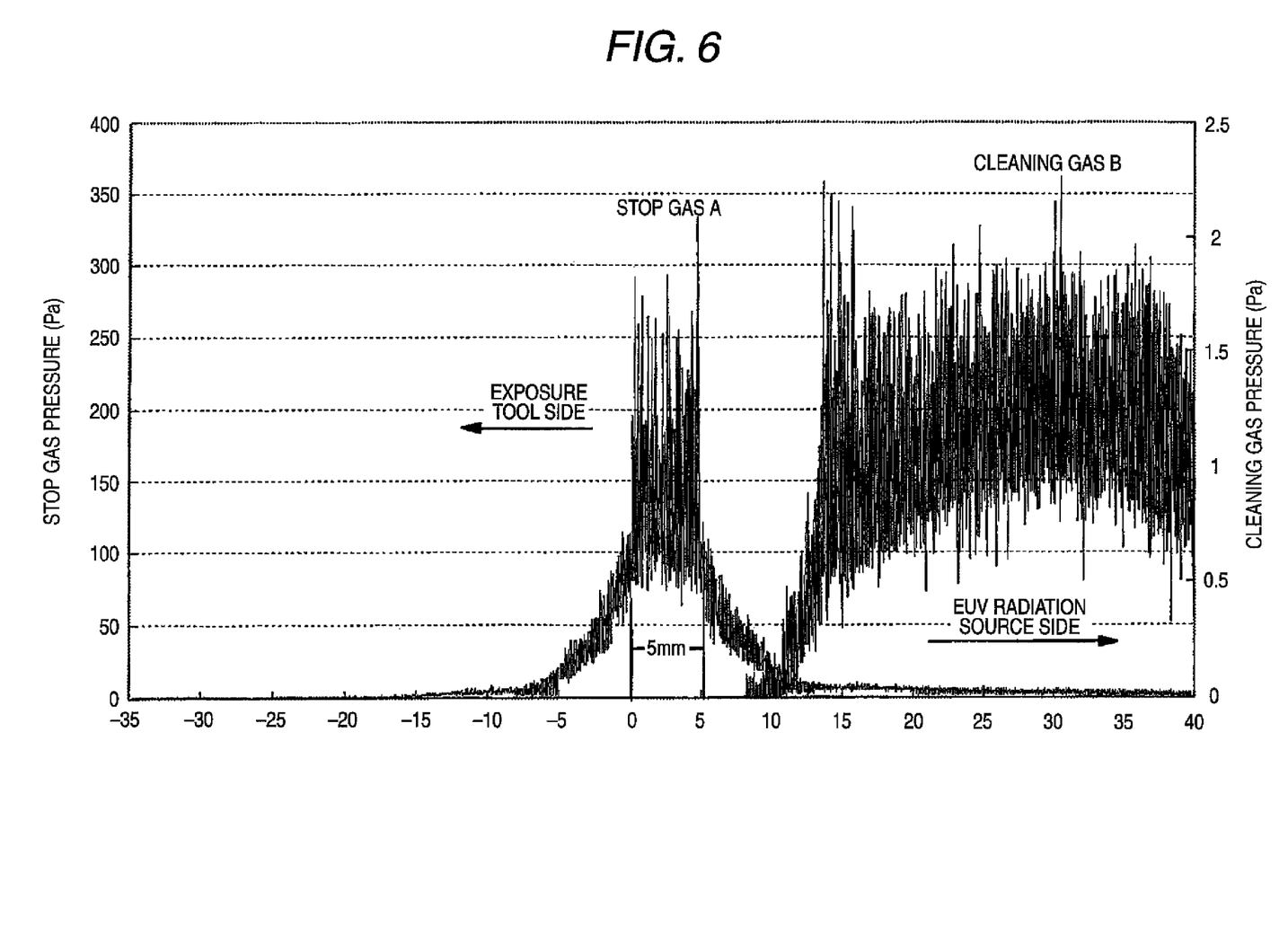
FIG. 6 is a diagram illustrating a gas pressure distribution of a connection device according to the third exemplary embodiment of the present invention.

FIG. 6 shows a gas pressure distribution of the connection device of the third exemplary embodiment. Similarly to FIG. 4, the pressure distribution on the X-axis in FIG. 2 is shown. A horizontal axis represents a distance in the X-axis direction shown in FIG. 2 from the center of the stop gas inlet 32, and a vertical axis represents a pressure (Pa). A graph A represents a pressure distribution of the stop gas, and a graph B represents a pressure distribution of the gas (e.g., cleaning gas) supplied to the EUV radiation source. Gas pressure of the differential pumping portion is shown.

In FIG. 6, since the edges of both sides of the pressure of the stop gas become lower, it is possible to prevent the stop gas from flowing into the EUV radiation source as well as flowing into the exposure tool of the stop gas. For example, as compared with each point of 15 mm, which is one of edge points of the stop gas A, in the X-axis in FIGS. 5 and 6, it can be seen that pressure of the stop gas A in FIG. 6 is suppressed more than that in FIG. 5. Accordingly, a thickness of a part where the pressure of the stop gas is 100 Pa with respect to the passing direction of the EUV radiation becomes smaller than that of the second exemplary embodiment.

According to the experimental results, when the thickness of the part where the pressure is 100 Pa with respect to the passing direction of the EUV radiation is about 6 mm or less, the permeability of the EUV radiation can be a desired value (e.g., 0.975) or more if the pressure of the stop gas is 300 Pa or less.

In addition, in the first to third exemplary embodiments, a nozzle having a rectangular opening is used for the gas inlet 32 shown in FIG. 2. However, when a supersonic nozzle is used as the nozzle, the shape of the pressure distribution of the stop gas is further improved, thereby further reducing the widths of the edges on both sides of the pressure of stop gas.

According to exemplary embodiments of the present invention, the communication hole for connecting the first depressurization vessel that sends out the extreme ultraviolet radiation and the second depressurization vessel that receives the extreme ultraviolet radiation is provided with the gas inlet and gas outlet for the stop gas to be opposed to each other, and the stop gas which does not absorb the extreme ultraviolet radiation is allowed to flow in a direction perpendicular to the passing direction of the extreme ultraviolet radiation, thereby forming the gas curtain. Accordingly, the gas in the first depressurization vessel is prevented from flowing into the second depressurization vessel. Since the stop gas is exhausted from the opposed gas outlet, the thickness of the high pressure layer formed by the stop gas becomes smaller. In addition, the stop gas does not flow into the first depressurization vessel or the second depressurization vessel, and thus it is possible to reduce the influence on pressure of both vessels. Since the concentration distribution of the stop gas is uniform, the permeability distribution of the EUV radiation is also uniform.

Further, the second gas outlet for exhausting gas is provided on the second depressurization vessel side with respect to the gas inlet and the gas outlet, and thus it is possible to exhaust the gas going toward the second depressurization vessel without flowing into the gas outlet. The third gas outlet for exhausting gas is additionally provided on the first depressurization vessel side with respect to the gas inlet and the gas outlet, and thus it is possible to exhaust the gas going toward the first depressurization vessel without flowing into the gas outlet.

Accordingly, the thickness of the high pressure layer formed at the communication hole by the stop gas with respect to the passing direction of the EUV radiation becomes smaller, and thus it is possible to prevent a decrease in permeability of the EUV radiation caused by the stop gas. In addition, it is possible to reduce the influence of the stop gas on the pressure of the first depressurization vessel and the second depressurization vessel as small as possible.

According to one or more aspects of the present invention, an exposure equipment is provided. The exposure equipment includes a first depressurization vessel that has a component for radiating extreme ultraviolet radiation and a first opening for sending out the extreme ultraviolet radiation; a second depressurization vessel that has a second opening for receiving the extreme ultraviolet radiation sent from the first depressurization vessel; and a connection device configured to connect the first depressurization vessel to the second depressurization vessel, wherein the connection device includes a communication hole, wherein the first opening and the second opening are opposed to each other and are connected to opening ends on both sides of the communication hole; a gas inlet that flows gas, which does not absorb the extreme ultraviolet radiation, in a direction perpendicular to a passing direction of the extreme ultraviolet radiation; and a first gas outlet provided to be opposed to the gas inlet so as to exhaust the gas; at least one second gas outlet provided on the second depressurization vessel side with respect to the first gas outlet so as to exhaust the gas; and at least one third gas outlet provided on the first depressurization vessel side with respect to the first has outlet so as to exhaust the gas, a gas supply unit connected to the gas inlet so as to supply the gas to the connection device; and a gas exhaust unit comprising first gas exhaust unit connected to the first gas outlet so as to exhaust the gas; a second gas exhaust unit connected to one of the at least one second gas outlet so as to exhaust the gas; and a third gas exhaust unit connected to one of the at least one third gas outlet so as to exhaust the gas.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

ENGLISH TRANSLATION IN THE DRAWINGS

[FIG 1]
  15: PULSED POWER SUPPLY
  6: MOTOR
  9a: FIRST GAS EXHAUST UNIT
  9b: SECOND GAS EXHAUST UNIT
  9c: RADIATION SOURCE GAS EXHAUST UNIT
  14: RAW MATERIAL SUPPLY UNIT
  P: PLASMA
  30d: FIFTH GAS EXHAUST UNIT
  30b: THIRD GAS EXHAUST UNIT
  30a: THIRD GAS SUPPLY UNIT
  30c: FOURTH GAS EXHAUST UNIT
  5: LASER IRRADIATOR
  16a: FIRST GAS SUPPLY UNIT
  16b: SECOND GAS SUPPLY UNIT
[FIG. 2A]
  30a: GAS SUPPLY UNIT
  #1: OPENING
  #2: GAS FLOW
  #3: GAS CURTAIN
  #4: DIFFERENTIAL PUMPING PORTION
[FIG. 2B]
  30b: THIRD GAS EXHAUST UNIT
[FIG. 3A]
  #1: EXPOSURE TOOL
  #2: EXHAUST
  #3: GAS
  #4: DIFFERENTIAL PUMPING PORTION
  #5: X DIRECTION
  #6: EUV RADIATION SOURCE
[FIG. 3B]
  #1: EXPOSURE TOOL
  #2: EXHAUST
  #3: GAS
  #4: DIFFERENTIAL PUMPING PORTION
  #5: X DIRECTION
  #6: EUV RADIATION SOURCE
[FIG. 3C]
  #1: EXPOSURE TOOL
  #2: EXHAUST
  #3: GAS
  #4: DIFFERENTIAL PUMPING PORTION
  #5: X DIRECTION
  #6: EUV RADIATION SOURCE
[FIG. 4]
  #1: STOP GAS PRESSURE (Pa)
  #2: STOP GAS A
  #3: CLEANING GAS B
  #4: EXPOSURE TOOL SIDE
  #5: EUV RADIATION SOURCE SIDE
  #6: CLEANING GAS PRESSURE (Pa)
[FIG. 5]
  #1: STOP GAS PRESSURE (Pa)
  #2: STOP GAS A
  #3: CLEANING GAS B
  #4: EXPOSURE TOOL SIDE
  #5: EUV RADIATION SOURCE SIDE
  #6: CLEANING GAS PRESSURE (Pa)
[FIG. 6]
  #1: STOP GAS PRESSURE (Pa)
  #2: STOP GAS A
  #3: CLEANING GAS B
  #4: EXPOSURE TOOL SIDE
  #5: EUV RADIATION SOURCE SIDE
  #6: CLEANING GAS PRESSURE (Pa)
[FIG. 7]
  15: PULSED POWER SUPPLY
  6: MOTOR
  9a: FIRST GAS EXHAUST UNIT
  9b: SECOND GAS EXHAUST UNIT
  9c: RADIATION SOURCE GAS EXHAUST UNIT
  14: RAW MATERIAL SUPPLY UNIT
  P: PLASMA
  20a: THIRD GAS SUPPLY UNIT
  5: LASER IRRADIATOR
  16a: FIRST GAS SUPPLY UNIT
  16b: SECOND GAS SUPPLY UNIT
[FIG. 8]
  #1: EXPOSURE TOOL
  #2: GAS
  #3: DIFFERENTIAL PUMPING PORTION
  #4: EUV RADIATION SOURCE
  #5: X DIRECTION
[FIG. 9]
  #1: STOP GAS PRESSURE (Pa)
  #2: STOP GAS A
  #3: CLEANING GAS B
  #4: EXPOSURE TOOL SIDE
  #5: EUV RADIATION SOURCE SIDE
  #6: CLEANING GAS PRESSURE (Pa)

What is claimed is:

1. A device for connecting a first depressurization vessel to a second depressurization vessel, the device comprising:
   a communication hole comprising:
   a first opening which is connected to the first depressurization vessel, and
   a second opening which is connected to the second depressurization vessel, the first opening and the second opening being, respectively, at opposite ends of the communication hole such that extreme ultraviolet radiation passes in a radiation direction from the first opening to the second opening;
   a gas inlet through which a gas from a gas supply unit flows into the communication hole in a direction perpendicular to the radiation direction of the extreme ultraviolet radiation; and
   a first gas outlet which is opposed to the gas inlet such that the gas is exhausted from the gas outlet by a first gas exhaust unit;
   at least one second gas outlet provided on a side of the second depressurization vessel with respect to the first gas outlet such that the gas supplied through the gas inlet is exhausted by a second gas exhaust unit, wherein the second gas outlet is arranged not opposed to the gas inlet.

2. The device of claim 1, wherein the gas does not absorb the extreme ultraviolet radiation.

3. The device of claim 2, further comprising:
   at least one third gas outlet provided on a side of the first depressurization vessel with respect to the first gas outlet such that the gas supplied through the gas inlet is exhausted by a third gas exhaust unit, wherein the third gas outlet is arranged not opposed to the gas inlet.

4. The device according to claim 2, wherein a pressure inside the first depressurization vessel is higher than a pressure inside the second depressurization vessel.

5. The device according to claim 1, wherein an opening of the gas inlet and an opening of the first gas outlet each has a rectangular shape of about 5 mm by about 5 mm.

6. An exposure equipment comprising:
a first depressurization vessel that comprises a component for radiating extreme ultraviolet radiation and a first opening through which the extreme ultraviolet radiation passes;
a second depressurization vessel that comprises a second opening for receiving the extreme ultraviolet radiation passed from the first depressurization vessel; and
a connection device which connects the first depressurization vessel to the second depressurization vessel, the connection device comprising:
- a communication hole comprising two opening ends disposed on opposite sides, respectively, of the communication hole, wherein the first opening and the second opening are opposed to each other and are connected to respective ones of the two opening ends;
- a gas inlet through which a gas, which does not absorb the extreme ultraviolet radiation, flows in a direction perpendicular to a passing direction of the extreme ultraviolet radiation; and
- a first gas outlet which is provided at a position opposed to the gas inlet so as to remove the gas from the communication hole;
- at least one second gas outlet which is provided between the second depressurization vessel and the first gas outlet so as to remove the gas from the communication hole; and
- at least one third gas outlet which is provided between the first depressurization vessel and the first gas outlet so as to remove the gas from the communication hole;
a gas supply unit connected to the gas inlet so as to supply the gas to the connection device; and
a gas exhaust unit comprising:
- a first gas exhaust unit connected to the first gas outlet so as to remove the gas;
- a second gas exhaust unit connected to one of the at least one second gas outlet so as to remove the gas; and
- a third gas exhaust unit connected to one of the at least one third gas outlet so as to remove the gas.

* * * * *